United States Patent
Henno et al.

(10) Patent No.: US 6,657,179 B1
(45) Date of Patent: Dec. 2, 2003

(54) PHOTOTRANSISTOR LIGHT SENSOR HAVING A FEEDBACK ARRANGEMENT

(75) Inventors: Christiane Henno, Tuebingen (DE); Roger Bauer, Reutlingen (DE); Stephan Mettler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/914,132

(22) PCT Filed: Feb. 8, 2000

(86) PCT No.: PCT/DE00/00375
§ 371 (c)(1),
(2), (4) Date: Apr. 12, 2002

(87) PCT Pub. No.: WO00/50858
PCT Pub. Date: Aug. 31, 2000

(30) Foreign Application Priority Data

Feb. 24, 1999 (DE) .......................................... 199 07 970

(51) Int. Cl.[7] ............................................. H01L 31/00
(52) U.S. Cl. .................................. 250/214.1; 250/214 R
(58) Field of Search .......................... 250/214.1, 214 R, 250/214 A, 214 LA; 327/514, 515; 356/221–226; 257/290, 184, 187

(56) References Cited

U.S. PATENT DOCUMENTS

| 4,282,429 | A | * | 8/1981 | Galbraith .............. 250/214 RC |
| 4,555,623 | A |   | 11/1985 | Bridgewater et al. |
| 5,091,640 | A |   | 2/1992 | Cornhill et al. |

FOREIGN PATENT DOCUMENTS

DE  42 09 536  9/1993

* cited by examiner

Primary Examiner—Que T. Le
(74) Attorney, Agent, or Firm—Kenyon & Kenyon

(57) ABSTRACT

A light sensor having increased sensitivity and improved reaction speed includes a phototransistor and a source-follower transistor as an impedance converter for a potential of a main electrode of the phototransistor, and a second transistor as a feedback element between the second main electrode of the phototransistor and its control electrode.

10 Claims, 4 Drawing Sheets

PHOTOTRANSISTOR LIGHT SENSOR HAVING A FEEDBACK ARRANGEMENT

FIELD OF THE INVENTION

The present invention relates to a light sensor having a phototransistor and an impedance converter for a potential of a main electrode of the phototransistor.

BACKGROUND INFORMATION

Such a light sensor is discussed, for instance, in German Published Patent Application No. 4 299 536.

As characterized, in this light sensor, the control electrode of the phototransistor is connected, together with its second main electrode, to a first supply potential of the light sensor.

Also, as characterized, in this light sensor, the phototransistor is operated in a weak inversion condition, which gives it a linear output characteristic of the photocurrent or a logarithmic output characteristic of the photovoltage as a function of the received illuminance. Such sensors may be advantageous because they may make possible registration free from modulation over several decades, and are thereby well suited for optical detection applications, for example, in motor vehicle technology, where pictures have to be processed which have extremely strong differences of brightness, as, for instance, while driving with oncoming traffic during darkness or in case of sunlight reflections from a preceding vehicle, the correct registration of which challenges even the human eye.

A disadvantage of this sensor may be that operation in a weak inversion condition may deliver only a very low photocurrent density of the light-sensitive boundary surface of the phototransistor, and it therefore may be necessary to use large surface phototransistors to generate photocurrents of sufficient strength and having adequate signal-to-noise ratio. The high-sensitivity resolution of a light sensor constructed from an arrangement of such light sensors is correspondingly low.

A further problem that may arise from the necessary great extension of the light-sensitive boundary surfaces may be their considerable capacitance. The greater the capacitance, the longer it may take, at a change of illuminance, for the photocurrent, changed in response to the change in illumination, to lead to a change in potential at the input to the source-follower, and thus, to a change in the measuring signal delivered by the light sensor. This effect may be referred to as a "streaking effect".

However, for applications in the automobile sector, fast reaction times of light sensors may be required, because, in order to effectively support the driver of a motor vehicle while traveling, such applications, as, for example, automatic rear-end collision protection while driving in convoy, may require a shorter reaction time than the driver.

SUMMARY OF THE INVENTION

The feedback element provided according to an exemplary embodiment of the present invention may provide great changes in the output signal of the light sensor at relatively low illumination-dependent changes in the terminal potentials of the phototransistor, and, as a result, at relatively low charges to be shifted at an illumination change in the phototransistor. A high sensitivity and high reaction speed of the light sensor may simultaneously be reached in this way.

According to the exemplary embodiment of the present invention, when the second main electrode of the phototransistor and its control electrode are no longer tied directly to the supply potential, as may be the case with the light sensor discussed in the Background Information, but are instead coupled via a feedback element, the gate potential of the phototransistor may be varied as a function of photocurrent or of the brightness hitting the phototransistor, respectively. The conductivity of the phototransistor modulated thereby, at low fluctuations of the photocurrent, should lead to strong changes in potential at the first main electrode of the phototransistor which the impedance converter converts into a signal which can be further processed outside the light sensor.

In order to attain a logarithmic characteristic response of the light sensor, and thus, its applicability over more than several decades of illuminance, the phototransistor may be expediently operated in a weak inversion condition.

As a feedback element, a transistor can be used which has, for example, a control electrode connected to the second main electrode of the phototransistor, a first main electrode connected to the control electrode of the phototransistor and a second main electrode connected to a first supply potential. This transistor, too, may be operated in a weak inversion condition.

As impedance converter, a further transistor can be used, which is connected to the first main electrode of the phototransistor, as source-follower.

A resistive element, which may likewise be a transistor, can be connected between the second main electrode of the phototransistor and the first supply potential; in order to make possible changes in the potential at the control electrode of the transistor used as feedback element, as a function of the photocurrent.

A semiconductor junction of the phototransistor operated in the blocking direction forms a current path between the first and a second supply potential. This junction can be, for example, the junction between a bulk electrode of the phototransistor and its source electrode. This bulk electrode may also be connected directly to the first supply potential (VDD in FIG. 2). An additionally shortened reaction time of the light sensor may occur when the bulk electrode is connected to the output of the source-follower transistor.

An additionally strengthened feedback may be attained when the first main electrode of the transistor forming the feedback element is connected to the second main electrode of the source-follower transistor.

DETAILED DESCRIPTION

Figure 1:
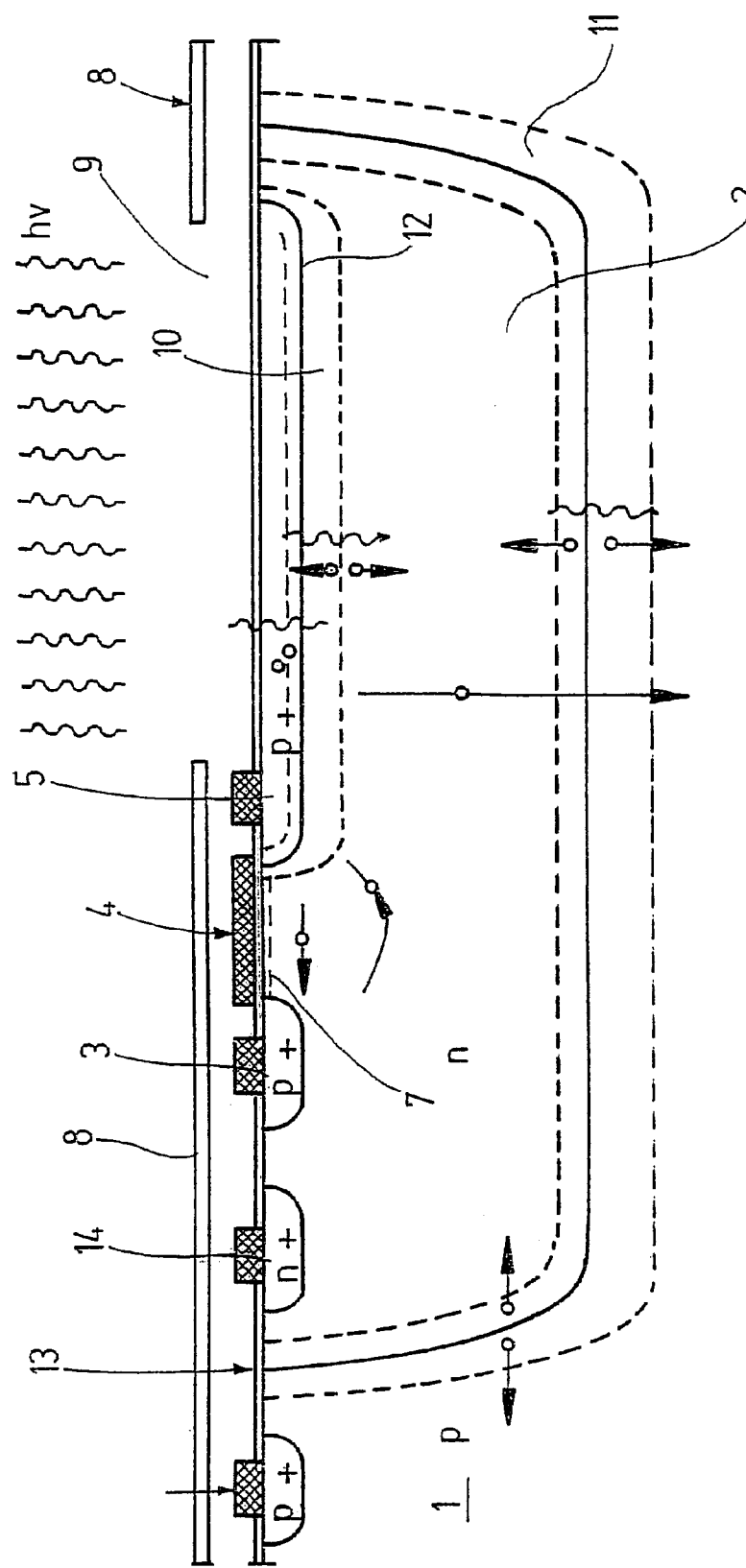
FIG. 1 shows a sectional view of a phototransistor usable within the framework of an exemplary embodiment of the present invention in PMOS technology.

FIG. 1 shows a section through a p-conductive semiconductor substrate 1, in which an n-well 2 is formed. Two p+-doped regions at the surface of the well form the main electrodes drain 3 and source 5 of an MOS phototransistor. A control or gate electrode 4, insulated by an oxide layer 6, covers the edges of the p+-doped regions of drain and source as well as channel zone 7 of the well. With the exception of source electrode 5, the surface of well 2 and its surroundings are covered by a light-proof metal layer 8.

Light penetrating through window 9 into the semiconductor material effects the creation of electron-hole pairs therein. In space charge regions 10, 11 on both sides of the pn-boundaries 12, 13 between source 5 and well 2 or between well 2 and substrate 1, respectively, the charge carriers are separated by the electrical field present there, and a photocurrent develops. Minority charge carriers, which were generated outside the space charge zone, can reach one of the space charge zones 10, 11 by diffusion. The minority charge carriers which have diffused into space charge zone also contribute to the photocurrent, while those diffused into space charge zone 11 increase the substrate/bulk current. Thus the holes are collected and drained off via the two p-doped regions, source 5 and substrate 1, but the electrons are carried off via the n-well. Bulk electrode 14 can be used for this, which is formed by an n+-doped region on the surface of the well.

Figure 2:
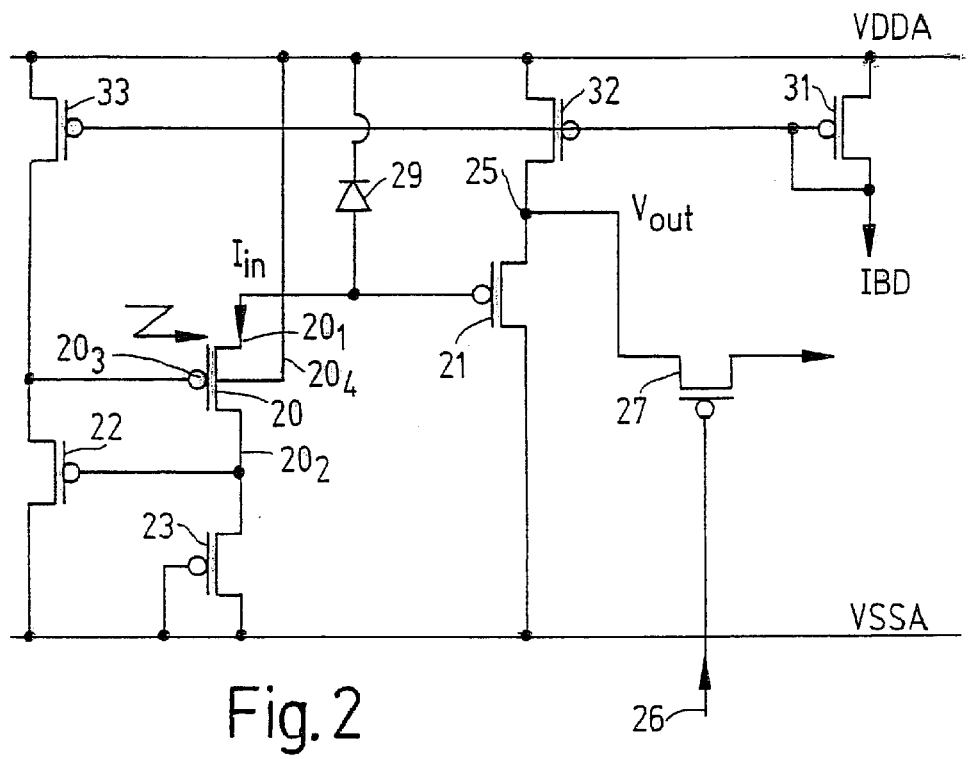
FIG. 2 shows a circuit of a brightness sensor according to an exemplary embodiment of the present invention.

FIG. 2 shows a schematic circuit diagram of a light sensor according to a first exemplary embodiment of the present invention. The circuit is integrated on a semiconductor substrate, and the core component is a phototransistor 20, which can be constructed as shown in FIG. 1. A first main electrode of the phototransistor $20_1$ is connected to a supply potential VDDA via a semiconductor boundary 29, which is represented in the circuit diagram as a diode. Boundary 29 is reverse-biased in reverse direction, and only a minimal current flows. Apart from this minimal current, main electrode $20_1$ can be regarded as a floating source. This boundary 29 corresponds essentially to boundary 12 between source 5 and well 2 of the phototransistor shown in FIG. 1, from where electrons leak away into supply potential VDDA, through well 2 and bulk electrode 14. Thus, in practice, it is a part of phototransistor 20, and therefore, in the circuit diagrams of FIGS. 3 through 6, which contain a phototransistor 20 of the same kind, it is no longer illustrated as an independent circuit element.

A transistor 23 is connected between the second main electrode $20_2$ of phototransistor 20 and a supply potential VSSA. An intended task of transistor 23 is to decouple the potential at main electrode $20_2$ from supply potential VSSA, so that the former can vary as a function of the strength of current $I_{in}$ flowing through phototransistor 20.

The control electrode of a further transistor 22 is connected to main electrode $20_2$. Transistor 22, together with a regulating transistor 33, is connected in series -between the two supply potentials VDDA and VSSA. Control electrode $20_3$ of the phototransistor is connected to the center point between transistors 22 and 33.

Regulating transistor 33, with the aid of a further regulating transistor 31 and a control signal IBD is activated in such a way that the potential at control electrode $20_3$ of the phototransistor is always low enough to guarantee operation of phototransistor 20 as well as transistors 22 and 23, at low inversion.

Intensification of incident light on phototransistor 20 leads to an increase of its transmission and thus to an increase in photocurrent $I_{in}$ flowing through. Correspondingly, the voltage drop at transistor 23 or the potential at the control electrode of transistor 22, respectively, increases. As a result, the transmission of transistor 22 decreases, the potential at control electrode $20_3$ of the phototransistor increases, and the transmission of phototransistor 20 decreases. The potential at main electrode $20_1$ of phototransistor 20, which, as a result, likewise increases, is simultaneously present at the control electrode of a source-follower transistor 21. The source-follower transistor 21, together with a further regulating transistor 32, is connected in series between the supply potentials VDDA and VSSA. Regulating transistor 32 is controlled in the same way as regulating transistor 33 by input signal IPD, but is dimensioned in such a way that source-follower transistor 21 does not operate in a weak inversion condition.

By the use of this circuit configuration, at center point 25, between source-follower transistor 21 and regulating transistor 32 a potential is obtained having low internal impedance, which is proportional to the logarithm of the illuminance received by phototransistor 20 over several decades (up to 8). This potential $V_{out}$ is output to a (not illustrated) bus line via a switching transistor 27, activated from outside the light sensor by a decoder line 26, and a plurality of equally designed light sensors can be connected to the bus line.

With this circuitry, the potential pending at the second main electrode $20_2$ is fed back to control electrode $20_3$ via transistor 22, a considerably stronger change of the input potential of source-follower transistor 21 is attained than is possible with the usual, feedback-free brightness sensors in CMOS technology. In addition, the feedback regulation at control electrode 20, acting counter to a change in the photocurrent, leads to small changes in the voltage decreasing itself at the phototransistor, even in changeable brightness conditions. Fluctuations in the voltage drop as a result of changes in brightness take place predominantly at transistor 23. This means that only low capacitances have to be reloaded at a change in brightness, based on the considerably smaller dimensions of transistor 23 compared to the phototransistor, so that the output signal of the circuit can follow the change in brightness. Thus the use of the circuit not only changes the sensitivity of the brightness sensor but also its reaction speed.

Figure 3:
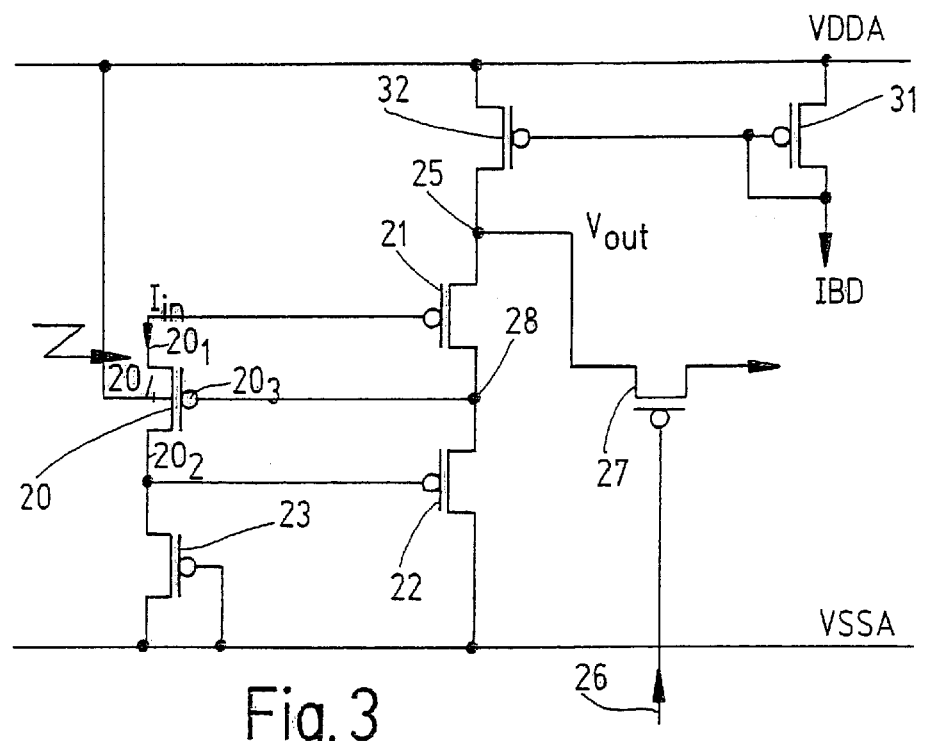
FIG. 3 shows a circuit of a brightness sensor according to another exemplary embodiment of the present invention.

FIG. 3 shows another exemplary embodiment of the circuit in FIG. 2, in which the regulating transistor 33 is omitted. Instead, transistor 22 is connected in series with the configuration of regulating transistor 32 and source-follower transistor 21, and control electrode $20_3$ of the phototransistor is connected at the center point 28 between transistors 21 and 22. The principle of feedback between second main electrode $20_2$ and control electrode $20_3$ of phototransistor 20 with the aid of transistors 23 and 22 is the same as in the case of FIG. 2. The series connection of transistors 21 and 22 additionally gives rise to a second feedback mechanism. For, if the potential at center point 28 rises as a result of increasing brightness, this potential increase leads, in addition to activating source-follower transistor 21 via the main electrode of phototransistor 20, to an increase in potential $V_{out}$ at point 25. And so, using the circuit design of the brightness sensor according to FIG. 3, a further increased sensitivity of the brightness sensor is attained, using fewer circuit elements (and correspondingly less usage of semiconductor substrate surface).

Figure 4:
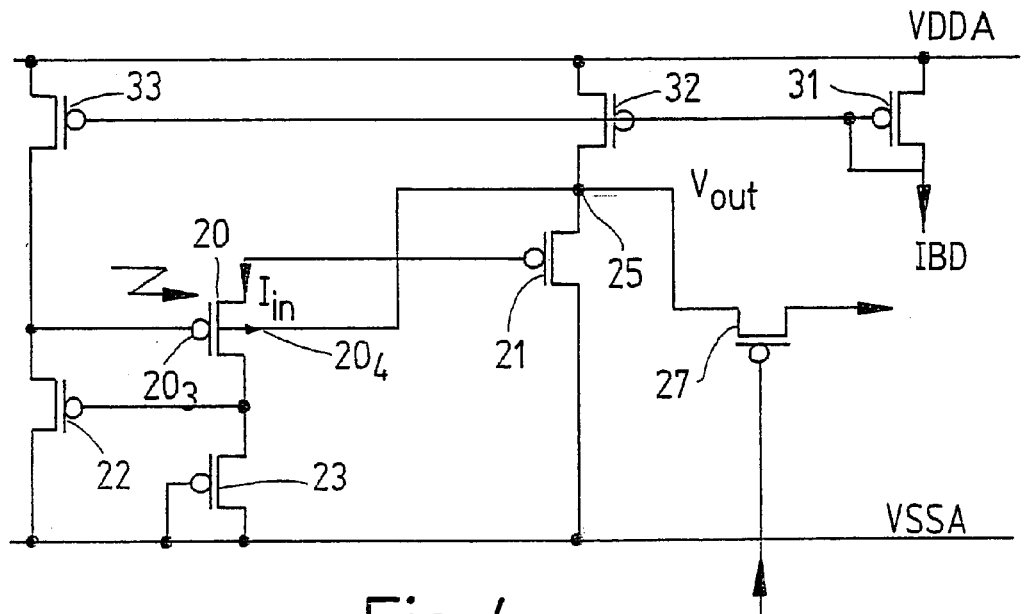
FIG. 4 shows a circuit of a brightness sensor according to another exemplary embodiment of the present invention.

FIG. 4 shows another exemplary embodiment of the circuit in FIG. 2, in which a second feedback mechanism is employed. The difference from the light sensor in FIG. 2 is that, here, bulk electrode $20_4$ of phototransistor 20 is connected to center point 25 between regulating transistor 32 and source-follower transistor 21. The output signal $V_{out}$ of the light sensor is fed back, in this way, to bulk electrode $20_4$, and thus fixes the potential of well 2 (see FIG. 1) of the phototransistor. For clarification, in the following, supply potential VDDA should be assumed to be the positive potential and supply potential VSSA to be ground or zero, as the case may be. It should be understood here that there may be other relationships, with a corresponding choice of conductivities or doping of transistors, respectively.

If there is a positive potential at bulk electrode $20_4$ (or rather 14 in FIG. 1), electrons are drawn off from the n-conducting well, and depleted zones form at charge carriers on both sides of pn-boundary layers 12, 13. The higher the positive potential at the bulk electrode, the broader is the depleted zone, and the larger are the charges which have to flow through the phototransistor in case of a change in the illuminance, until a new steady state of the thickness of the depleted zone is reached, and, along with that, of the voltage drop at the phototransistor. In the exemplary embodiment of FIG. 4, this is avoided by not having a steady supply potential at the bulk electrode, but by having the variable output potential of the circuit, i.e. the voltage difference between source 5 and well 2 of the phototransistor always equal to the voltage difference between the first main electrode of the source-follower transistor connected to point 25 and its control electrode 21. The voltage range, limited by this, between well and source of the phototransistor makes possible once again a shortening of the phototransistor's reaction time, or rather an improvement of the lag effect by a factor of 4.

Figure 5:
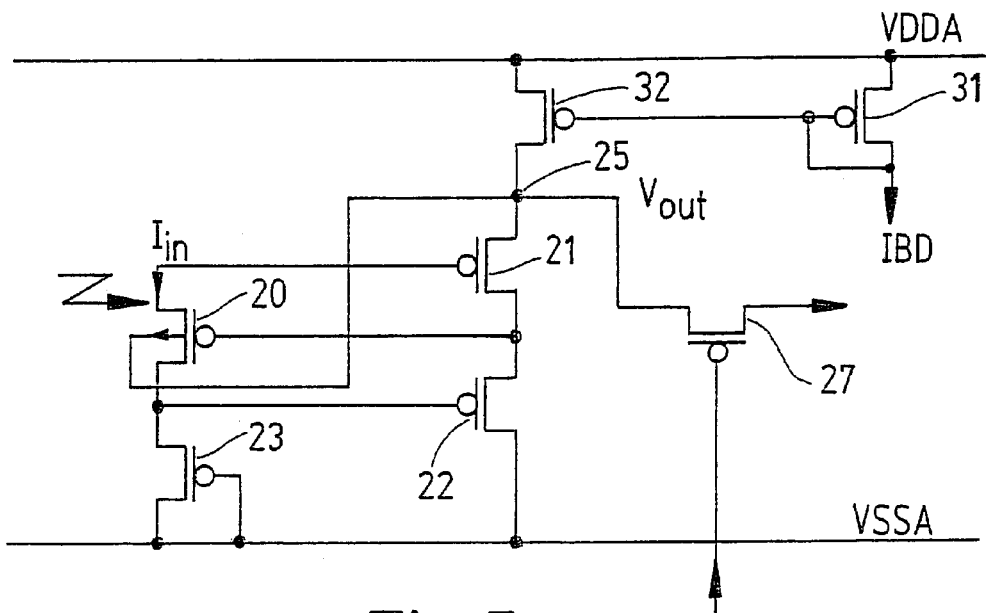
FIG. 5 shows a circuit of a brightness sensor according to another exemplary embodiment of the present invention.

As shown in FIG. 5, the exemplary embodiments of FIGS. 3 and 4 can be combined with each other: This achieves at the same time the series connection of transistor 22 with transistors 32 and 21, and the connection of the bulk electrode of phototransistor 20 with center point 25 between transistors 21 and 32. This combines the increased sensitivity and the design of the exemplary embodiment of FIG. 3 with the short reaction time of the exemplary embodiment of FIG. 4.

Figure 6:
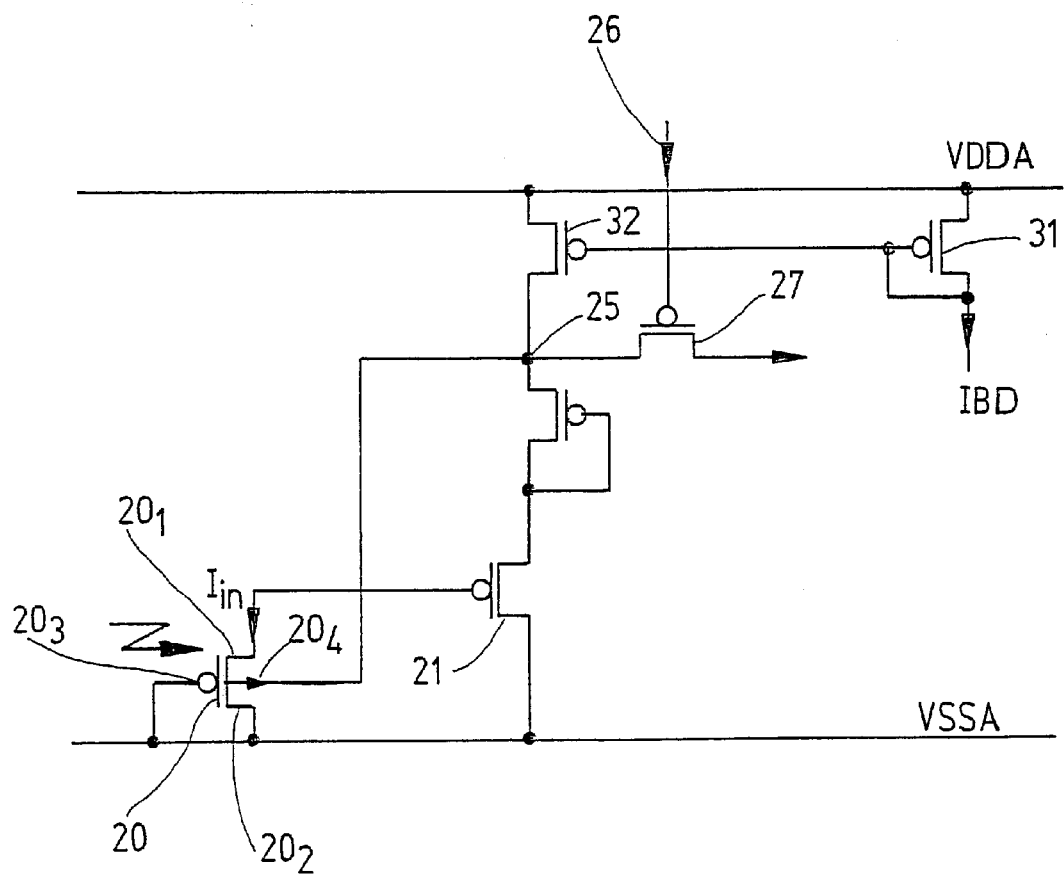
FIG. 6 shows a circuit of a brightness sensor according to another exemplary embodiment the present invention.

FIG. 6 shows that the feedback between point 25 and bulk electrode $20_4$ of the phototransistor can also be applied without using a transistor like transistor 22 in FIGS. 2 through 5. Even in this exemplary embodiment, it is believed that the reaction speed of the light sensor may be clearly improved.

What is claimed is:

1. A light sensor comprising:
   a phototransistor having a first main electrode, a second main electrode and a control electrode;
   a first transistor operable as an impedance converter to provide a first potential at the first main electrode;
   a feedback arrangement to feed back a second potential at the second main electrode to the control electrode, wherein the feedback arrangement includes a second transistor.

2. The light sensor of claim 1, wherein the phototransistor is operated in a weak inversion condition.

3. The light sensor of claim 1, wherein the second transistor is operated in a weak inversion condition.

4. The light sensor of claim 1, wherein the first transistor is connected to operate as a source-follower to the first main electrode of the phototransistor.

5. The light sensor of claim 4, wherein the second main electrode of the phototransistor is connected to a first supply potential by a resistive arrangement.

6. The light sensor of claim 5, wherein the resistive arrangement includes a third transistor.

7. The light sensor of claim 4, wherein the second main electrode of the first transistor connected to operate as the source-follower is connected to a first supply potential one of directly and by the feedback arrangement.

8. The light sensor of claim 1, wherein the phototransistor includes a bulk electrode connected to a second supply potential.

9. The light sensor of claim 1, wherein the phototransistor includes a bulk electrode connected to an output of the first transistor connected to operate as the source-follower.

10. The light sensor of claim 1, wherein the first main electrode of the second transistor is connected to the second main electrode of the first transistor, and the first transistor is connected to operate as a source-follower.

* * * * *